United States Patent
Wei et al.

(10) Patent No.: US 12,494,376 B2
(45) Date of Patent: Dec. 9, 2025

(54) CONTROL METHOD OF MULTI-STAGE ETCHING PROCESS AND PROCESSING DEVICE USING THE SAME

(71) Applicant: UNITED MICROELECTRONICS CORP., Hsinchu (TW)

(72) Inventors: Liang Ju Wei, Chiayi (TW); Chung-Yi Chiu, Tainan (TW); Zhen Wu, Kaohsiung (TW); Hsuan-Hsu Chen, Tainan (TW); Chun-Lung Chen, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 284 days.

(21) Appl. No.: 17/903,417

(22) Filed: Sep. 6, 2022

(65) Prior Publication Data
US 2024/0047225 A1    Feb. 8, 2024

(30) Foreign Application Priority Data
Aug. 3, 2022    (TW) .................................. 111129157

(51) Int. Cl.
*H01L 21/321*    (2006.01)
*H01J 37/32*    (2006.01)
*H01L 21/3213*    (2006.01)

(52) U.S. Cl.
CPC .. *H01L 21/32139* (2013.01); *H01J 37/32926* (2013.01); *H01J 2237/334* (2013.01)

(58) Field of Classification Search
None
See application file for complete search history.

(56) References Cited

U.S. PATENT DOCUMENTS

| | | |
|---|---|---|
| 7,596,422 B2 | 9/2009 | Chard |
| 8,747,684 B2 | 6/2014 | Srinivasan |
| 8,907,456 B2 * | 12/2014 | Wei ..................... H01L 21/0337 257/618 |

FOREIGN PATENT DOCUMENTS

WO    WO-2017049175 A1 *    3/2017    ....... G05B 19/41885

* cited by examiner

*Primary Examiner* — Shamim Ahmed
(74) *Attorney, Agent, or Firm* — WPAT, PC

(57)    ABSTRACT

A control method of a multi-stage etching process and a processing device using the same are provided. The control method of the multi-stage etching process includes the following step S. A stack information of a plurality of hard mask layers is set. An etching target condition is set. Through a machine learning model, a parameter setting recipe of the hard mask layers is generated under the etching target condition. The machine learning model is trained based on the stack information of the hard mask layers, a plurality of process parameters and a process result.

9 Claims, 5 Drawing Sheets

CONTROL METHOD OF MULTI-STAGE ETCHING PROCESS AND PROCESSING DEVICE USING THE SAME

This application claims the benefit of Taiwan application Serial No. 111129157, filed Aug. 3, 2022, the disclosure of which is incorporated by reference herein in its entirety.

TECHNICAL FIELD

The disclosure relates in general to a control method of a semiconductor process and an electronic device using the same, and more particularly to a control method of a multi-stage etching process and a processing device using the same.

BACKGROUND

Under the situation that the size of semiconductor components is required to be more and more fine, a multi-stage etching technology has been developed, so that the width after etching can be reduced. In the multi-segment etching technology, it is necessary to stack a plurality of hard mask layers and gradually etch these hard mask layers.

Traditionally, in the multi-stage etching process, one or two layers of hard mask layers are mainly monitored, in order to hope that the final etching target can be achieved. However, in the case of the rapid development of semiconductor products, the hard mask layers used in the multi-stage etching technology has various material changes, and the stacking relationship of each layer is also different. Therefore, it is no longer possible to continuously monitor the same hard mask layers.

In the multi-stage etching process, the materials of the hard mask layers, the etching manners, and the process conditions are all variation factors. Those numerous variation factors may have an impact on the final etch target. It is difficult for the engineers to set these numerous variation factors, which forms a technical development bottleneck of the multi-segment etching technology.

SUMMARY

The disclosure is directed to a control method of a multi-stage etching process and a processing device using the same. A parameter setting recipe of a plurality of hard mask layers can be generated, through a machine learning model, under a stack information and an etching target condition of the hard mask layers. Through machine learning technology, numerous variation factors can be accurately set, so that the technical development bottleneck of the multi-segment etching technology can be broken.

According to one embodiment, a control method of a multi-stage etching process is provided. The control method of the multi-stage etching process includes the following steps. A stack information of a plurality of hard mask layers is set. An etching target condition is set. A parameter setting recipe of the hard mask layers is generated, through a machine learning model, under the etching target condition. The machine learning model is trained based on the stack information of the hard mask layers, a plurality of process parameters and a process result.

According to another embodiment, a processing device, for controlling a multi-stage etching process is provided. The processing device includes a multi-layer setting unit, a target setting unit and a machine learning model. The multi-layer setting unit is configured to set a stack information of a plurality of hard mask layers. The target setting unit is configured to set an etching target condition. The machine learning model is configured to generate, through a machine learning model, a parameter setting recipe of the hard mask layers under the etching target condition. The machine learning model is trained based on the stack information of the hard mask layers, a plurality of process parameters and a process result.

Figure 1:
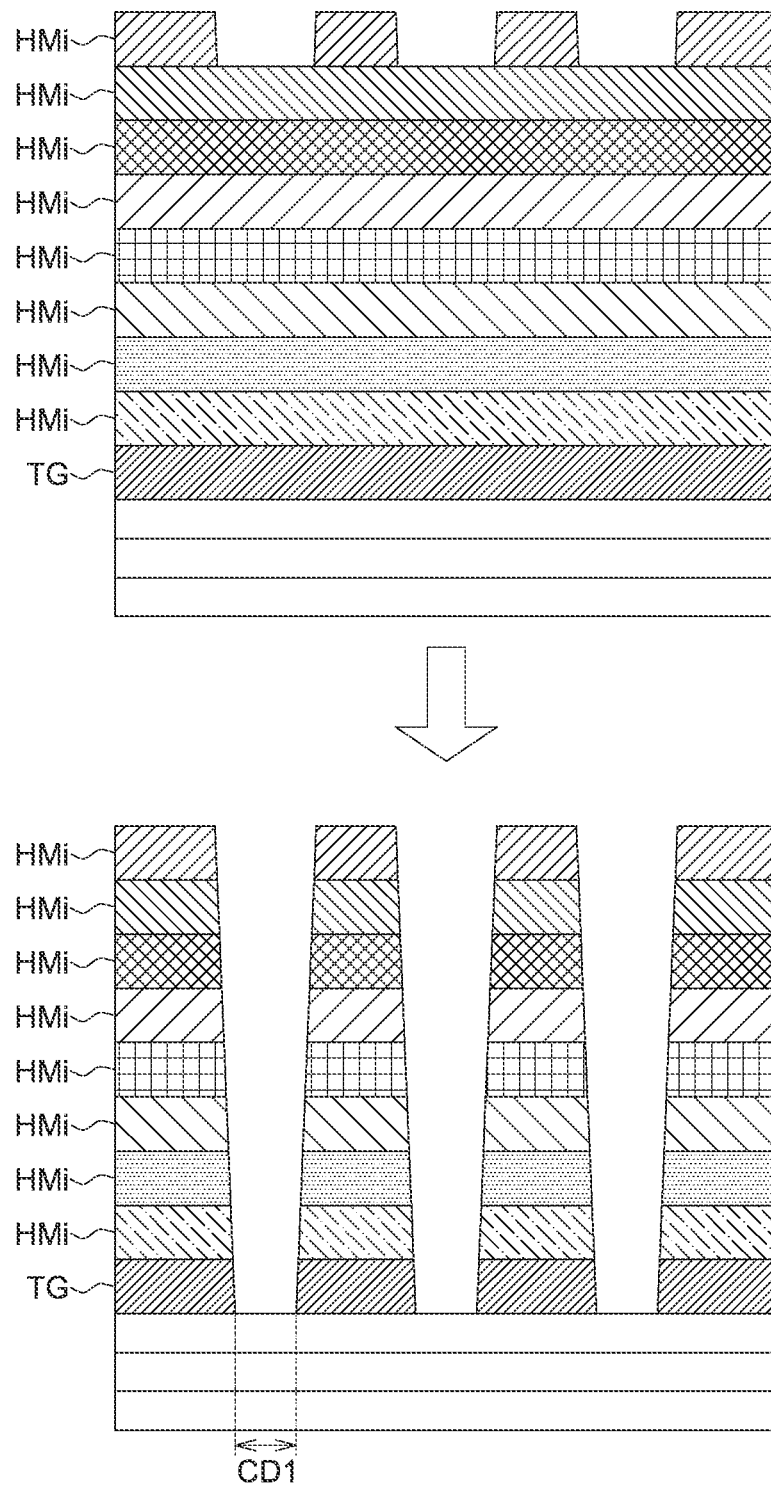
FIG. 1 shows a schematic diagram of a multi-stage etching process according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a schematic diagram of a multi-stage etching process according to an embodiment. To achieve the etching target condition that the target layer TG has a relatively narrow etching width CD1, it is necessary to perform multi-stage etching on the hard mask layers HMi. When etching the hard mask layers HMi, the respective variation factors, such as material, thickness, gas flow, bias RF power, or E-chuck temperature, etc., are needed to be controlled.

Figure 2:
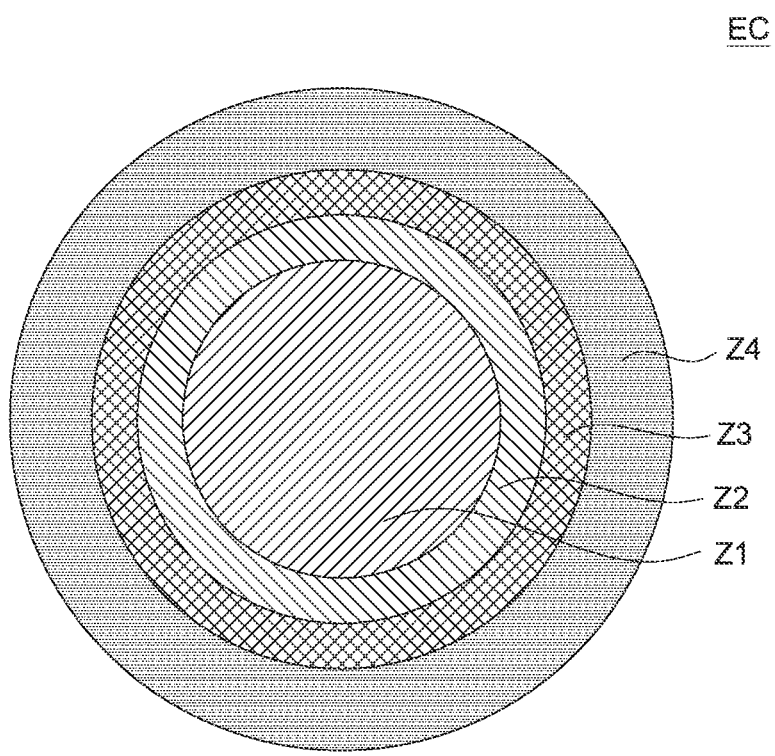
FIG. 2 illustrates the setting of E-chuck temperature.

Please refer to FIG. 2, which illustrates the setting of E-chuck temperature. Taking the E-chuck temperature as an example, the E-chuck EC is divided into zone Z1 to zone Z4. Each of the zones Z1 to Z4 needs to set the temperature. When etching different hard mask layers HMi, it is necessary to set the temperature for these zones Z1 to Z4. In this way, the setting of the E-chuck temperature alone forms several variation factors that affect the etching target condition. In this case, it is difficult to achieve the etching target condition by monitoring a specific step.

In addition, in addition to the E-chuck temperature, the materials and the thicknesses of the hard mask layers HMi, the gas flow rates for etching the hard mask layers HMi, and the bias RF power supplied for etching the hard mask layers HMi will form several influence variation factors for the etching target condition. In this case, it is difficult to achieve the etching target condition by monitoring a specific step.

In this embodiment, in order to accurately set these numerous variation factors, a machine learning technology is proposed. Through the machine learning technology, the numerous variation factors can be accurately set.

Figure 3:
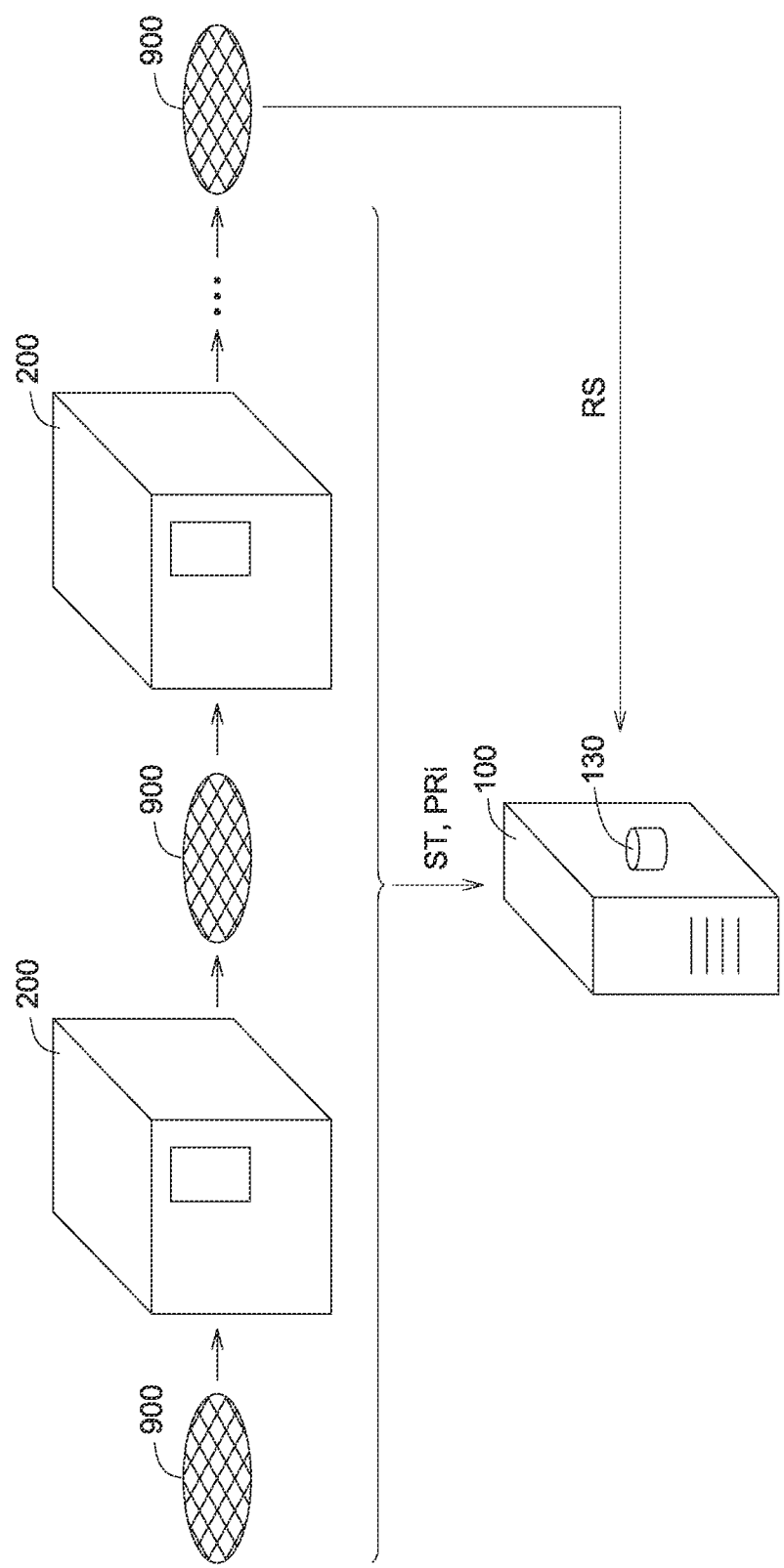
FIG. 3 shows a schematic diagram of the processing device according to an embodiment.

Please refer to FIG. 3, which shows a schematic diagram of the processing device 100 according to an embodiment. After the wafer 900 is performed the etching process on the hard mask layers HMi through the semiconductor apparatus 200, the stack information ST of the hard mask layers HMi, the process parameter PRi of the etching steps and the process result RS form a set of training data. After several multi-stage etching processes of the same product or different products, multiple sets of stack information ST, the process parameter PRi and the process result RS can be collected to form a large data set.

The processing device 100 of the present embodiment is trained by the large data set of the stack information ST, the process parameter PRi and the process result RS to obtain a machine learning model 130.

Figure 4:
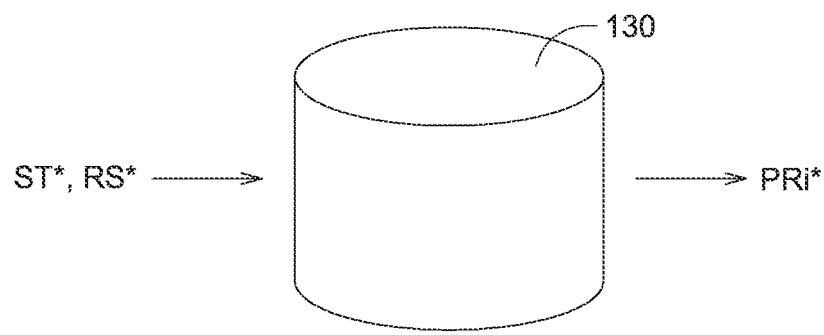
FIG. 4 illustrates an example of the online operation of the machine learning model.

Please refer to FIG. 4, which illustrates an example of the online operation of the machine learning model 130. After training the machine learning model 130, a stack information ST* and an etching target condition RS* can be input into the machine learning model 130 to obtain an appropriate set of parameter setting recipe PRi*. The etching target condition RS* is, for example, an etching rate, an edge profile, or a critical dimension. The edge profile is, for example, the angle at which the sidewall is etched. The critical dimension is, for example, the etching width CD1 mentioned above. The parameter setting recipe PRi* is, for example, a gas flow rate, a bias RF power, or an E-chuck temperature. In this way, the variation factors can be accurately set through the machine learning technology.

Figure 5:
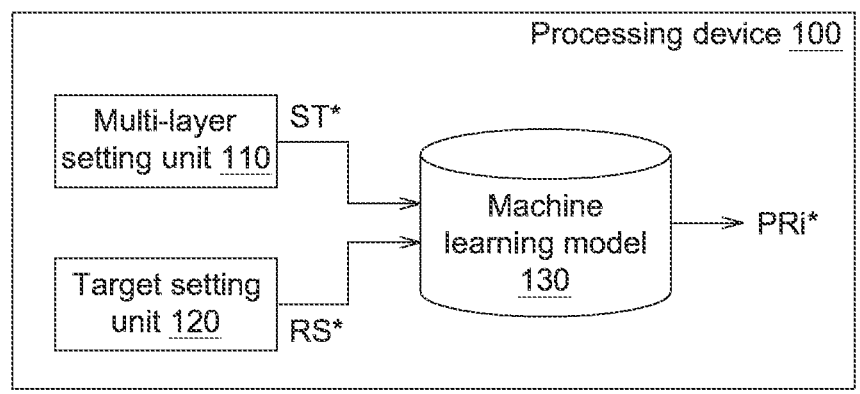
FIG. 5 shows a block diagram of a processing device according to an embodiment.

Please refer to FIG. 5, which shows a block diagram of a processing device 100 according to an embodiment. The processing device 100 includes a multi-layer setting unit 110, a target setting unit 120 and the machine learning model 130. The multi-layer setting unit 110, the target setting unit 120 and the machine learning model 130 are, for example, a circuit, a chip, a circuit board, a code or a storage device for storing the code. The processing device 100 of this embodiment can use the multi-layer setting unit 110 to set the stack information ST* of the hard mask layers HMi, and use the target setting unit 120 to set the etching target condition RS*. The machine learning model 130 can generate the parameter setting recipe PRi* of each hard mask layers HMi under the condition that the etching target condition RS* is satisfied. The following is a flow chart to describe the operation of each component in detail.

Figure 6:
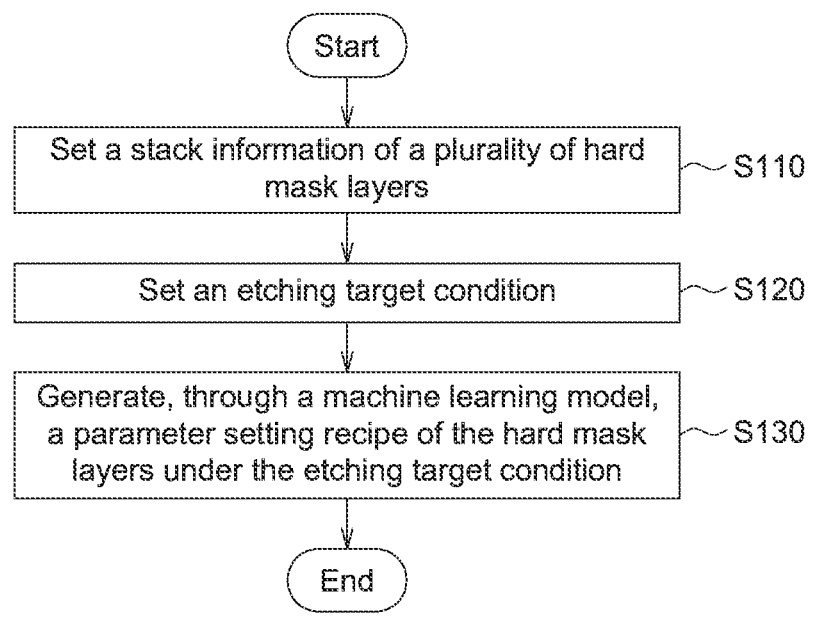
FIG. 6 shows a control method of the multi-stage etching process according to an embodiment.

Please refer to FIG. 6, which shows a control method of the multi-stage etching process according to an embodiment. In step S110, the multi-layer setting unit 110 sets the stack information ST* of the hard mask layers HMi. The stack information ST* includes, for example, the materials of the hard mask layers HMi, the thicknesses of the hard mask layers HMi and the stacking sequence of the hard mask layers HMi.

Next, in step S120, the target setting unit 120 sets the etching target condition RS*. The etching target condition RS* is, for example, the etching rate, the edge profile, or the critical dimension. In this step, the etching target condition RS* can be set for one of the hard mask layers HMi. Or, the etching target condition RS* can be set for more than two of the hard mask layers HMi which are adjacent. Alternatively, the etching target condition RS* can be set for whole of the hard mask layers HMi.

Then, in step S130, through machine learning model 130, the parameter setting recipe PRi* of the hard mask layers HMi is generated under the etching target condition RS*. The parameter setting recipe PRi* is, for example, the gas flow, the bias RF power, the E-chuck temperature or a combination thereof. In this step, the parameter setting recipe PRi* can be set for a single layer of the hard mask layers HMi. Or, the parameter setting recipe PRi* can be set for more than two of the hard mask layers HMi which are adjacent. Alternatively, the parameter setting recipe PRi* can be set for whole of the hard mask layers HMi.

According to the above-described embodiments, the parameter setting recipe PRi* of the hard mask layers HMi can be generated, through the machine learning model 130, under the stack information ST* and the etching target condition RS* of the hard mask layers HMi. Through machine learning technology, numerous variation factors can be accurately set, so that the technical development bottleneck of the multi-segment etching technology can be broken.

In the past multi-segment etching technology, the parameter control is only performed for each individual hard mask layer HMi to achieve the desired etching result in this layer. However, the present embodiment uses big data to string together the information of the stacked hard mask layers HMi into the stack information ST. The stacking relationship of the hard mask layers HMi is also considered in the deep learning technology.

Especially under the situation that the past history does not have the same stack information ST at all, the traditional technology cannot obtain the parameter setting recipe PRi*. The present embodiment utilizes the big data, so that any stack information ST with similar fragments in the past historical data will be integrated into the training of the machine learning model 130. Even if the past history does not have exactly the same stack information ST, the machine learning model 130 of this embodiment can still successfully obtain the parameter setting recipe PRi*.

In addition, in the past multi-segment etching technology, the etching result can only be monitored for a single hard mask layer HMi. Base on the machine learning model 130 trained through big data in this embodiment, the etching target condition RS* of any one (or even all) of the hard mask layers HMi can be arbitrarily set, and the control of the key hard mask layer HMi can be more stable.

Furthermore, in the past multi-segment etching technology, the process parameter can be monitored only for a single hard mask layer HMi. In this embodiment, base on the machine learning model 130 trained through big data, the output parameter setting recipe PRi* of any (or even all) of the hard mask layers HMi can be arbitrarily set, and the control of the etching width CD1 of the target layer TG can be more stable.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A control method of a multi-stage etching process, comprising:
  receiving, by a multi-layer setting circuit, a stack information of a plurality of hard mask layers, wherein the stack information includes materials of the hard mask layers, thicknesses of the hard mask layers and stacking sequence of the hard mask layers;
  receiving, by a target setting circuit, an etching target condition; and
  receiving, by a machine learning model circuit, the stack information and the etching target condition to generate a parameter setting recipe of the hard mask layers through machine learning, wherein the machine learning circuit is trained based on the stack information of the hard mask layers including the materials of the hard mask layers, the thicknesses of the hard mask layers and the stacking sequence of the hard mask layers, a plurality of process parameters, and a process result, and wherein the stack information includes the materials of the hard mask layers, the thicknesses of the hard mask layers and the stacking sequence of the hard mask layers; and etching the hard mask layers based on the parameter setting recipe.

2. The control method of the multi-stage etching process according to claim 1, wherein the etching target condition is an etching rate, an edge profile or a critical dimension.

3. The control method of the multi-stage etching process according to claim 1, wherein the parameter setting recipe is a gas flow, a bias RF power or an E-chuck temperature.

4. The control method of the multi-stage etching process according to claim 1, wherein the etching target condition is set for one of the hard mask layers.

5. The control method of the multi-stage etching process according to claim 1, wherein the etching target condition is set for more than two of the hard mask layers which are adjacent.

6. The control method of the multi-stage etching process according to claim 1, wherein the etching target condition is set for whole of the hard mask layers.

7. The control method of the multi-stage etching process according to claim 1, wherein the parameter setting recipe is set for one of the hard mask layers.

8. The control method of the multi-stage etching process according to claim 1, wherein the parameter setting recipe is set for more than two of the hard mask layers which are adjacent.

9. The control method of the multi-stage etching process according to claim 1, wherein the parameter setting recipe is set for whole of the hard mask layers.

* * * * *